(12) United States Patent
Yang et al.

(10) Patent No.: US 7,607,887 B2
(45) Date of Patent: Oct. 27, 2009

(54) FAN FRAME

(75) Inventors: Zhi-Ya Yang, Shenzhen (CN); Wen-Gao Wang, Shenzhen (CN); Zhen-Neng Lin, Shenzhen (CN); Shu-Ho Lin, Taipei Hsien (TW); Hsiang-Ho Huang, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 449 days.

(21) Appl. No.: 11/671,619

(22) Filed: Feb. 6, 2007

(65) Prior Publication Data

US 2008/0144278 A1 Jun. 19, 2008

(30) Foreign Application Priority Data

Dec. 15, 2006 (CN) .......................... 2006 1 0157541

(51) Int. Cl.
*F01D 25/12* (2006.01)
(52) U.S. Cl. .................. 415/213.1; 415/214.1; 415/220
(58) Field of Classification Search .............. 415/213.1, 415/214.1, 220, 224
See application file for complete search history.

(56) References Cited

U.S. PATENT DOCUMENTS

| D576,567 S | * | 9/2008 | Otsuki et al. ................ D13/179 |
| D584,698 S | * | 1/2009 | Ko et al. ..................... D13/179 |
| 2005/0225939 A1 | | 10/2005 | Otsuki et al. | |

* cited by examiner

*Primary Examiner*—Igor Kershteyn
(74) *Attorney, Agent, or Firm*—Frank R. Niranjan

(57) ABSTRACT

A fan frame includes a main body (10) and conducting wires (40) secured on the main body. The main body has a securing tab (30) extending from an outer surface thereof. The securing tab has a free end. A groove (32) for the wires to extend through is defined between the securing tab and the outer surface of the main body. At least a block (35) extends from the outer surface of the main body. A space (80) for receiving the wires therein is defined between the block, the securing tab and the outer surface of the main body. A guiding surface (352) is formed on the block from a bottom end towards a top end of the block for guiding the wires to move into the space.

20 Claims, 7 Drawing Sheets

FAN FRAME

BACKGROUND OF THE INVENTION

1. Field of the Invention

The present invention relates to an electric fan, and more particularly to a fan frame for an electric fan.

2. Description of Related Art

With the continuing development of electronic technology, electronic packages such as CPUs (central processing units) are generating more and more heat that requires immediate dissipation. Electric cooling fans are commonly used in combination with heat sinks for cooling the CPUs.

The CPU is mounted on a circuit substrate (for example, a printed circuit board) of the electronic equipment, and a power supply terminal which functions as a power supply of the fan is also provided on the circuit substrate. The fan is provided with a connection terminal and a lead wire to be connected to the power supply terminal. One end of the lead wire is soldered to a drive circuit of the fan, and the other end of the lead wire is connected to the power supply terminal. Since various electronic components are densely disposed in the vicinity of the CPU in which the heat sink is placed, the power supply terminal is not always disposed in the vicinity of the CPU, and the distance and the layout relation between the CPU and the power supply terminal are different depending upon the type and specification of the circuit substrate on which the CPU is mounted. Therefore, it is necessary that the length of the lead wire be such that a distance between the CPU and the power supply terminal is at it maximum possible length. When the fan has a long lead wire, how to securely wrap the lead wire around a fan frame of the fan becomes an issue, since if the lead wire is not securely attached to the fan frame of the fan, during transportation of the fan, the lead wire can be easily loosened from the fan frame to experience a possible damage, for example, an accidental pulling force acting thereon.

Therefore, it is desirable to provide a fan frame wherein one or more of the foregoing disadvantages may be overcome or at least alleviated.

SUMMARY OF THE INVENTION

According to a preferred embodiment of the present invention, a fan frame of an electronic fan includes a main body and conducting wires being secured on the main body. A securing tab extends outwardly from one side of an outer surface of the main body. The securing tab has a free end spaced from the main body. A groove for extension of the wires therethrough is defined between the securing tab and the outer surface of the main body. A block extends outwardly from an opposite side of the outer surface of the main body. Cooperatively the block, the securing tab and the outer surface of the main body define a space receiving the wires. A guiding surface is formed on an outer surface of the block for guiding the wires to move into the space. A horizontal holding surface is formed on a top end of the block for narrowing a bottom side of the space whereby the wires will not easily escape from the space.

Other advantages and novel features of the present invention will be drawn from the following detailed description of a preferred embodiment of the present invention with attached drawings, in which:

BRIEF DESCRIPTION OF THE DRAWINGS

Many aspects of the present fan frame can be better understood with reference to the following drawings. The components in the drawings are not necessarily drawn to scale, the emphasis instead being placed upon clearly illustrating the principles of the present fan frame. Moreover, in the drawings, like reference numerals designate corresponding parts throughout the several views.

DETAILED DESCRIPTION OF THE INVENTION

Figure 1:
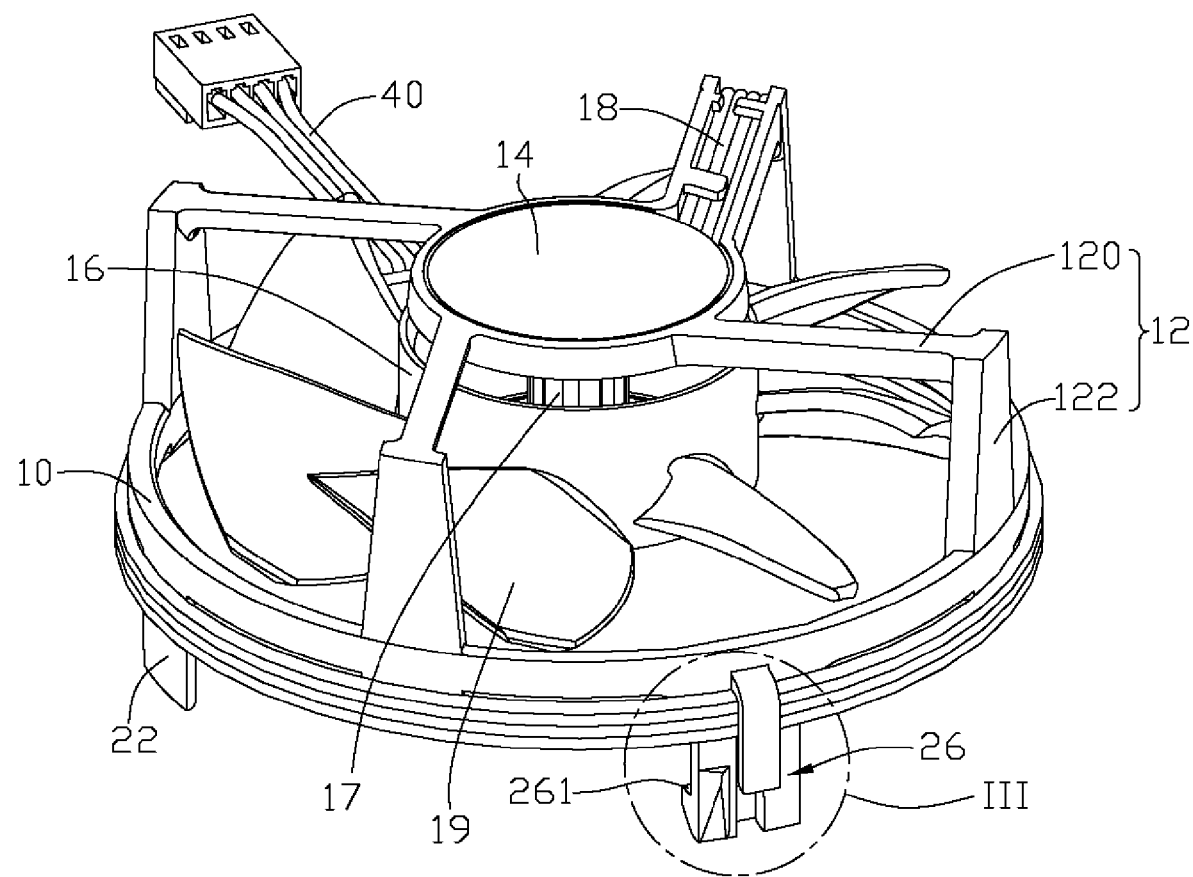
FIG. 1 is an isometric view of a fan frame in accordance with a preferred embodiment of the present invention.
Figure 2:
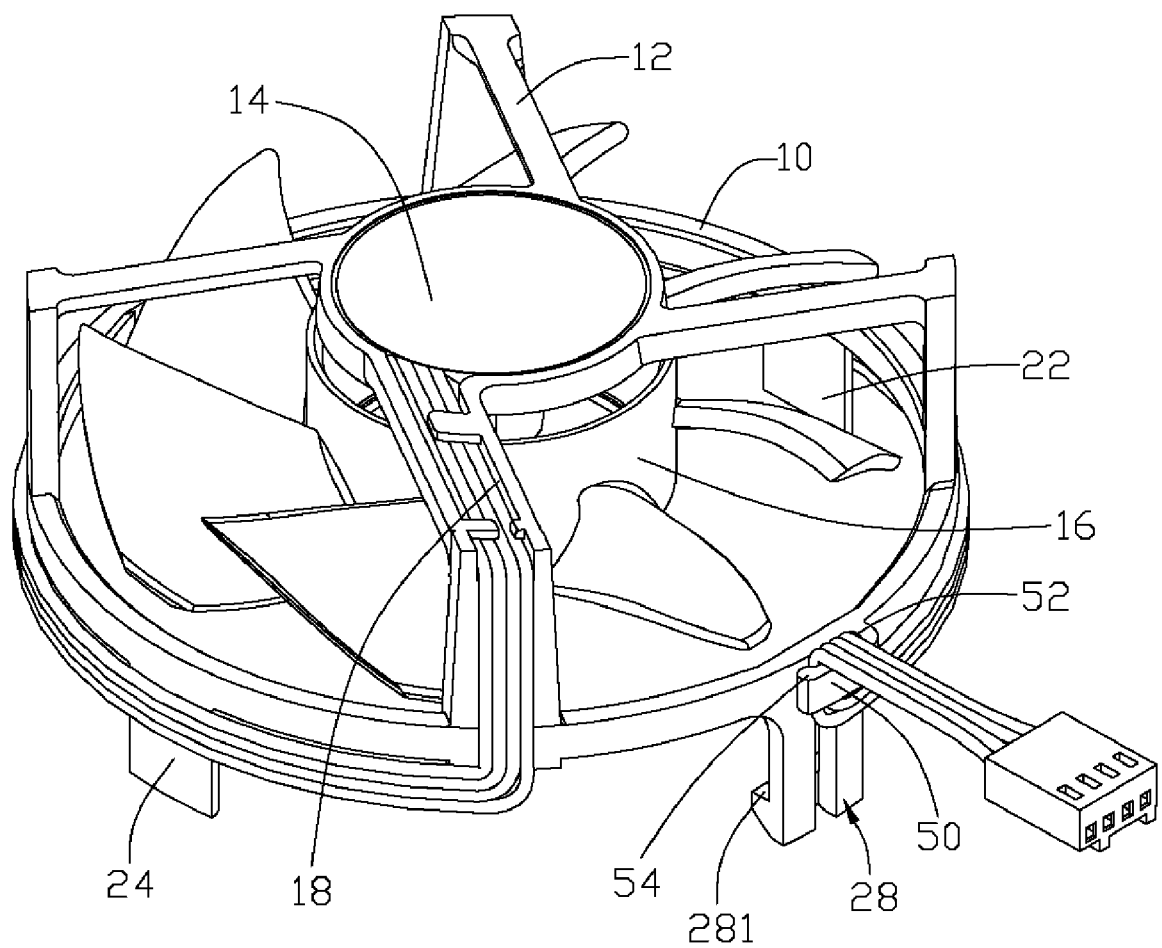
FIG. 2 is similar to FIG. 1, but shows the fan frame viewed from a different angle.

Referring to FIGS. 1 and 2, a fan frame of an electric fan in accordance with a preferred embodiment of the present invention includes a main body 10 and conducting wires 40 being secured to the main body 10.

The main body 10 is approximately ring-shaped. Alternatively, the main body 10 of the fan frame can be square-shaped. A circular-shaped supporting base 14 is formed in a central portion of the main body 10. A central tube 17 extends downwardly from the supporting base 14 to supporting a fan motor (not labeled) thereon. The fan motor includes a stator (not shown) mounted around the central tube 17, and a rotor 16 rotatably supported by the central tube 17. The rotor 16 has a plurality of fan blades 19 extending radially and outwardly therefrom. The stator has coils wound thereon for generating an alternating magnetic field interacting with a magnetic field of a permanent magnet of the rotor 16 to generate force. The rotor 16 is driven into rotation by the force to generate an airflow flowing to a heat dissipation apparatus (not shown), such as a heat sink, which is arranged on a heat-generating component (not shown) to dissipate the heat generated thereby.

Four ribs 12 extend outwardly from the supporting base 14 to connect with the main body 10 of the fan frame. The ribs 12 are evenly spaced from each other along a circumference of the supporting base 14. Each rib 12 is L-shaped, and includes a first portion 120 extending radially from the supporting base 14, and a second portion 122 bending perpendicularly from a free end of the first portion 120 to connect with the main body 10. The supporting base 14 and the ribs 12 are integrally formed with the main body 10 by injection molding. One of the ribs 12 defines a channel 18 in the first portion 120 thereof.

Each wire 40 has a conductive metal wire (not shown) covered with flexible resin (not labeled). One end (i.e., soldered end) of the wire 40 is soldered to the coils of the stator of the fan motor, and the other end (i.e., connected end) of the wire 40 extends outwardly to connect with a connection terminal (not labeled) by which the wire can electrically connect with a power source (not shown) for supplying a current to the coils to drive the fan motor. The conducting wires 40 include at least one wire 40 connected to a positive electrode of the power source, at least one wire 40 connected to a negative electrode of the power source, and one or more wires 40 being used for inputting and outputting signals such as the number of revolutions of the rotor 16, the temperature and the like so that the rotation speed of the electric fan can be controlled to meet the variable requirement of heat dissipation. A section of each wire 40 which is adjacent to the soldered end extends from the stator along the channel 18 of the first portion 120 of the rib 12, and then extends downwardly along the second portion of the rib 12. When assembled, the remainder portions of the conducting wires 40 wind around an outer surface of the main body 10 with the sections of the conducting wires 40 adjacent to the connected ends thereof being secured on the main body 10.

Figure 3:
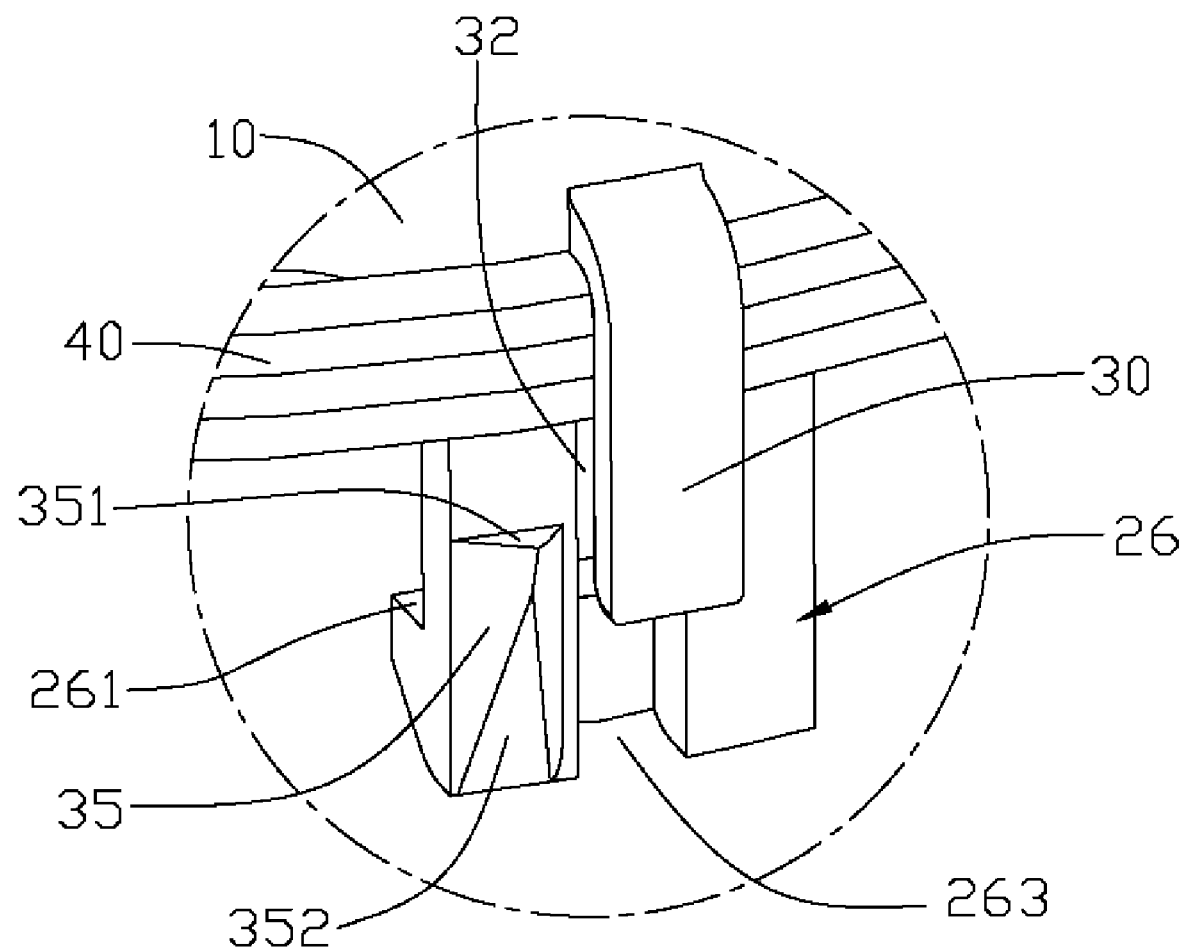
FIG. 3 is an enlarged view of a circled portion III of FIG. 1, showing in details a securing arm and a securing tab of the fan frame.
Figure 4:
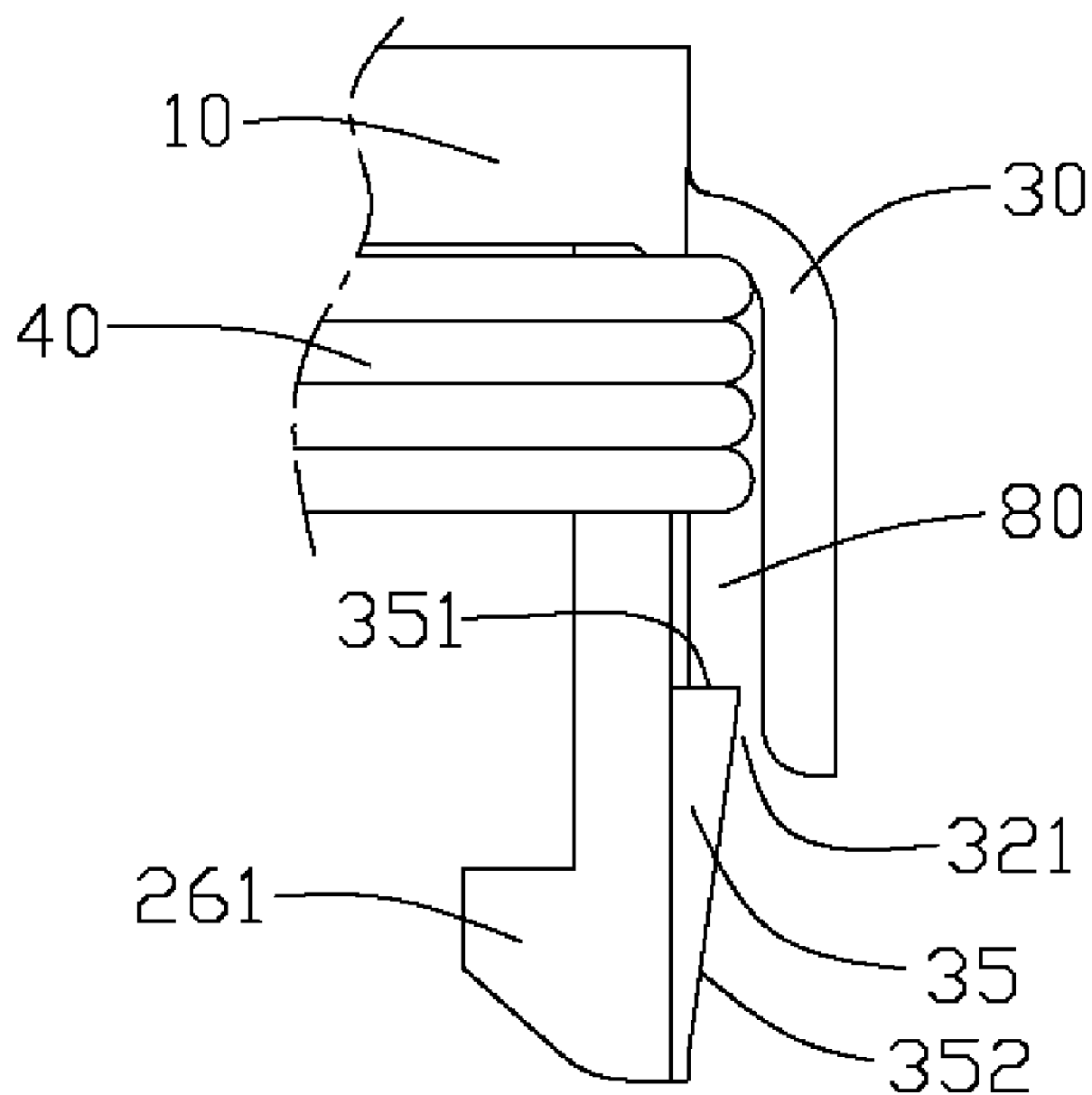
FIG. 4 is a side view of the securing arm and the securing tab of the fan frame shown in FIG. 3.

Referring to FIGS. 3-4, two mounting arms 22, 24 and two securing arms 26, 28 are integrally formed with and extend downwardly from the main body 10, which can be produced with little or no increase in production costs. The mounting arms 22, 24 and the securing arms 26, 28 are evenly spaced from each other and are arranged in alternating fashion along a circumferential direction of the main body 10. Each arm 22, 24, 26, 28 is located between two neighboring ribs 12 of the main body 10. In other words, the arms 22, 24, 26, 28 and the ribs 12 are evenly spaced from each other and are arranged in alternating fashion. The arms 22, 24, 26, 28 are sheet-like and thin, and increase a width of the main body 10 along the axial direction thereof to support the wires 40 having a relatively larger length and thus have more coils wound around the main body 10. Each securing arm 26, 28 forms a hook 261, 281 thereon. Each hook 261, 281 is formed on a bottom end of the securing arm 26, 28 and extends inwardly therefrom. When the electric fan is mounted on the heat dissipation apparatus, the hooks 261, 281 of the fan frame lock with the heat dissipation apparatus to secure them together. It is to be understood that the hooks 261, 281 can be formed on the mounting arms 22, 24. Alternatively, the hooks 261, 281 can be formed on both of the mounting arms 22, 24 and the securing arms 26, 28.

A retaining tab 50 extends outwardly from a top end of the securing arm 28 and then extends transversely along the circumferential direction of the main body 10. A free end of the retaining tab 50 is separated from the main body 10. A first groove 52 is thus defined between the main body 10 and the retaining tab 50 for receiving the wires 40. A protrusion 54 is formed on a free end of the retaining tab 50. The protrusion 54 extends inwardly from an inner surface of the retaining tab 50, and thus forms a narrow entrance which has a width smaller than that of the other portion of the first groove 52 to prevent the conducting wires 40 from coming off. A securing tab 30 extends outwardly from a top end of the securing arm 26 and then extends downwardly along the axial direction of the main body 10. The securing tab 30 is elongated. A free end of the securing tab 30 is separated from the securing arm 26. A second groove 32 is defined between the securing tab 30 and an outer surface of the securing arm 26 for extension of the conducting wires 40 therethrough. Along the circumferential direction of the main body 10, the securing tab 30 has a width being only about ⅓ of that of the securing arm 26 and is located centrally on the securing arm 26. The securing arm 26 is thus divided into a middle portion which is located about the securing tab 30, a left portion located on a left side of the middle portion, and a right portion located on a right side of the middle portion. A slot 263 is defined in the middle portion of the outer surface of the securing arm 26.

A block 35 extends outwardly from a bottom end of the left portion of the securing arm 26. The block 35 is wedge-shaped. A cross section of the block 35 gradually increases in size along the axial direction from the bottom end to the top end of the securing arm 26 of the main body 10, and thus an outer surface of the block 35 forms a slanted guiding surface 352. The block 35 forms a holding surface 351 on a top end thereof which is higher than the free end of the securing tab 30 to prevent the wires 40 from coming off. The holding surface 351 of the block 35 is triangle-shaped and is connected to the outer surface of the securing arm 26 directly. A narrow gap 321 is defined between the block 35 and the securing tab 30 for entrance of the conducting wires 40 therethrough. Thus, a space 80 (as shown in FIG. 4) is defined between the outer surface of the securing arm 26, the securing tab 30, and the holding surface 351 of the block 35 for receiving the conducting wires 40. Top side of the space 80 is closed by the securing tab 30, and bottom side thereof is narrowed by the holding surface 351 of the block 35.

When assembled, the conducting wires 40 extend outwardly from the stator along the channel 18 of the first portion 120 of the rib 12, and then extend downwardly along the second portion 122 of the rib 12. The remainder portions of the conducting wires 40 wind around the outer surface of the main body 10. The securing arms 26, 28 and the mounting arms 22, 24 formed on the main body 10 thus can support the wires 40 thereon. The wires 40 enter into the space 80 through the narrow gap 321 between the block 35 and the securing tab 30. Since the top side of the space 80 is closed, and the bottom side thereof is narrowed, the wires 40 cannot be accidentally removed from the space 80. In addition, the sections of the conducting wires 40 adjacent to the connected ends thereof are received in the first groove 52 of the retaining tab 50. As the protrusion 54 is formed on the free end of the retaining tab 50, the wires 40 cannot be accidentally removed from the narrow entrance of the first groove 52. Thus the wires 40 are secured on the main body 10 of the fan frame. In addition, the fan frame is made of resin, which is an elastic material; thus, even if the narrow gap 321 and the narrow entrance of the first groove 52 are smaller than the thickness of the wires 40, the securing tab 30 and the retaining tab 50 can be elastically deformed, and the wires 40 can easily be held in or detached from the space 80 and the first groove 52. Furthermore, the block 35 forms the slated guiding surface 352, the wires 40 can easily enter into the space 80 along the guiding surface 352. With this, it is possible to prevent entanglement of the wires 40, and prevent the wires 40 from interfering with other electronic component and from being accidentally pulled. Packing, transportation and handling of the electric fan are thus simplified.

In the first embodiment of the fan frame as shown above, the securing arm 28 forms the retaining tab 50 for the sections of the wires 40 adjacent to the connected ends thereof to be secured thereon; the securing arm 26 forms the securing tab 30 and the block 35 which cooperatively define the space 80 receiving the wires 40. It can be understood that both of the securing arms 26, 28 can form the retaining tab 30 and the space 80 thereon. In addition, the mounting arms 22, 24 can also form the retaining tab 30 or the space 80 thereon. With this configuration, each arm 22, 24, 26, 28 forms the retaining tab 50 and the space 80 thereon. The fan frame can provide several positions to securing the wires 40 thereon, which can secure the wires 40 tightly and evenly. The sections of the conducting wires 40 adjacent to the connected ends thereof can be secured on a nearest retaining tab 50 even if the wires have different lengths.

Figure 5:
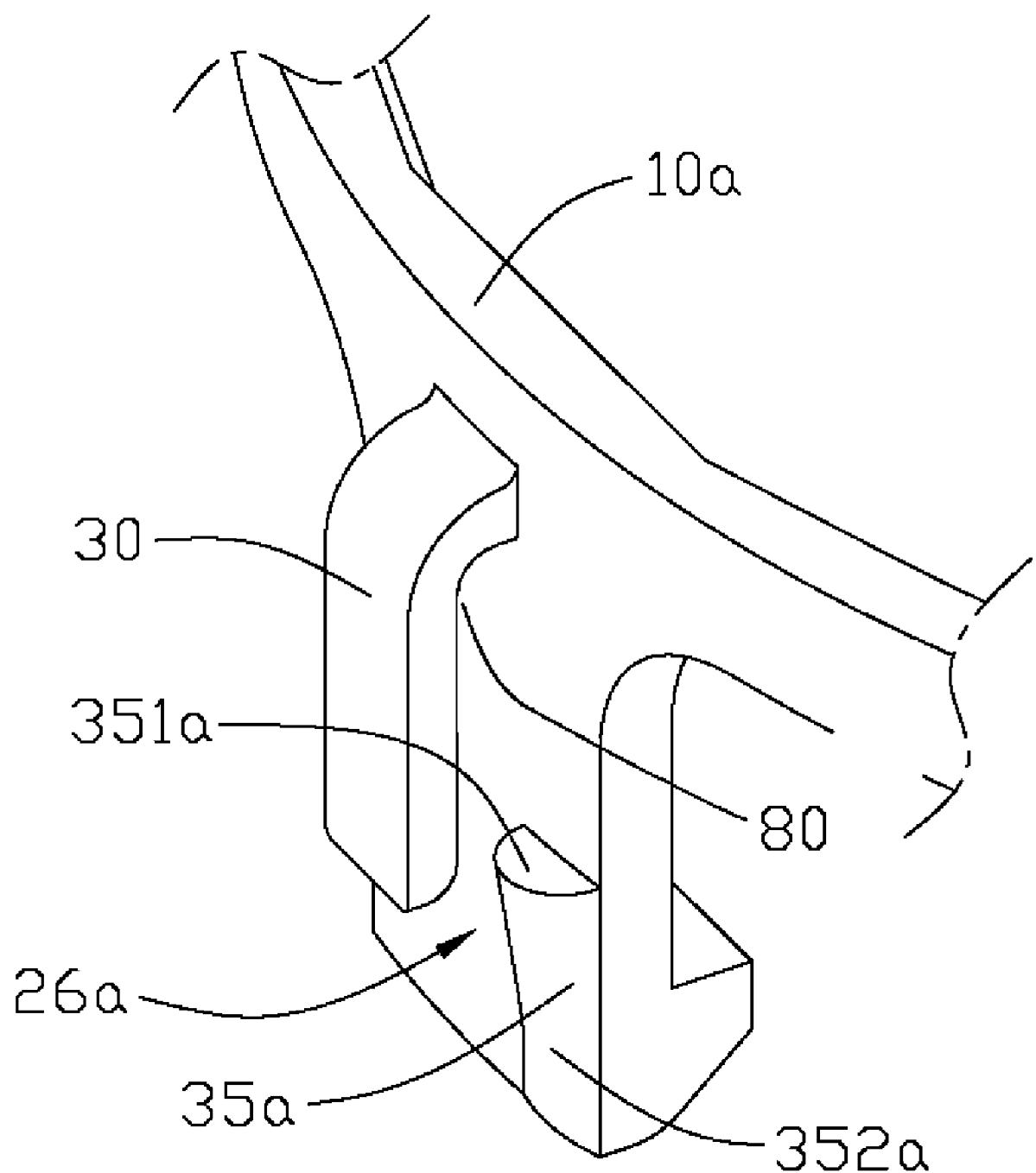
FIG. 5 shows an isometric view of a securing arm and a securing tab of the fan frame in accordance with a second embodiment of the present invention.

FIG. 5 shows an alternate embodiment of fan frame. The difference between the second embodiment and the first embodiment is that the block 35*a* is formed on the right portion of the securing arm 26*a* of the fan frame. The block 35*a* is tapered. The cross section of the block 35*a* gradually increases in size along the axial direction from the bottom end to the top end of the securing arm 26*a* of the main body 10*a*. The outer surface of the block 35*a* forms a curve-shaped guiding surface 352*a* to guide the wires 40 into the space 80. The holding surface 351*a* of the block 35*a* is semicircular. Also the holding surface 351*a* of the block 35*a* is higher than the free end of the securing tab 30.

Figure 6:
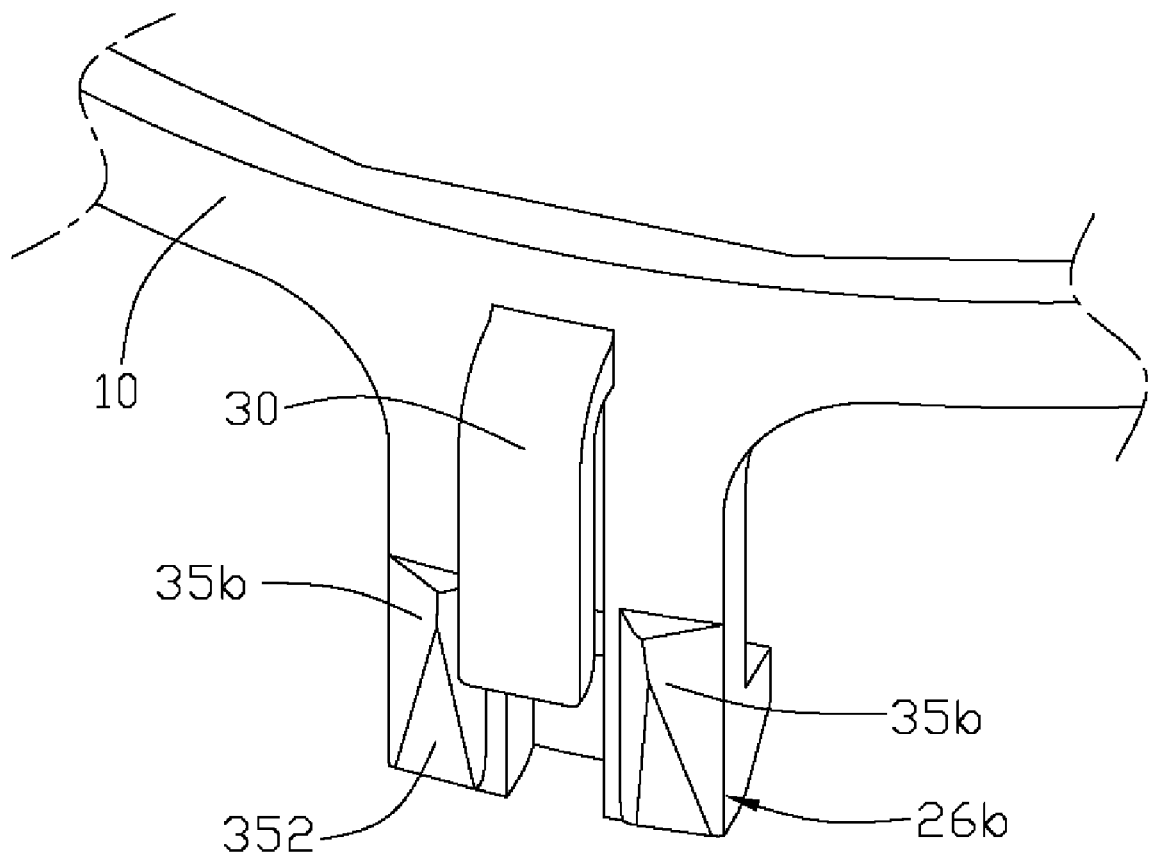
FIG. 6 shows an isometric view of a securing arm and a securing tab of the fan frame in accordance with a third embodiment of the present invention.
Figure 7:
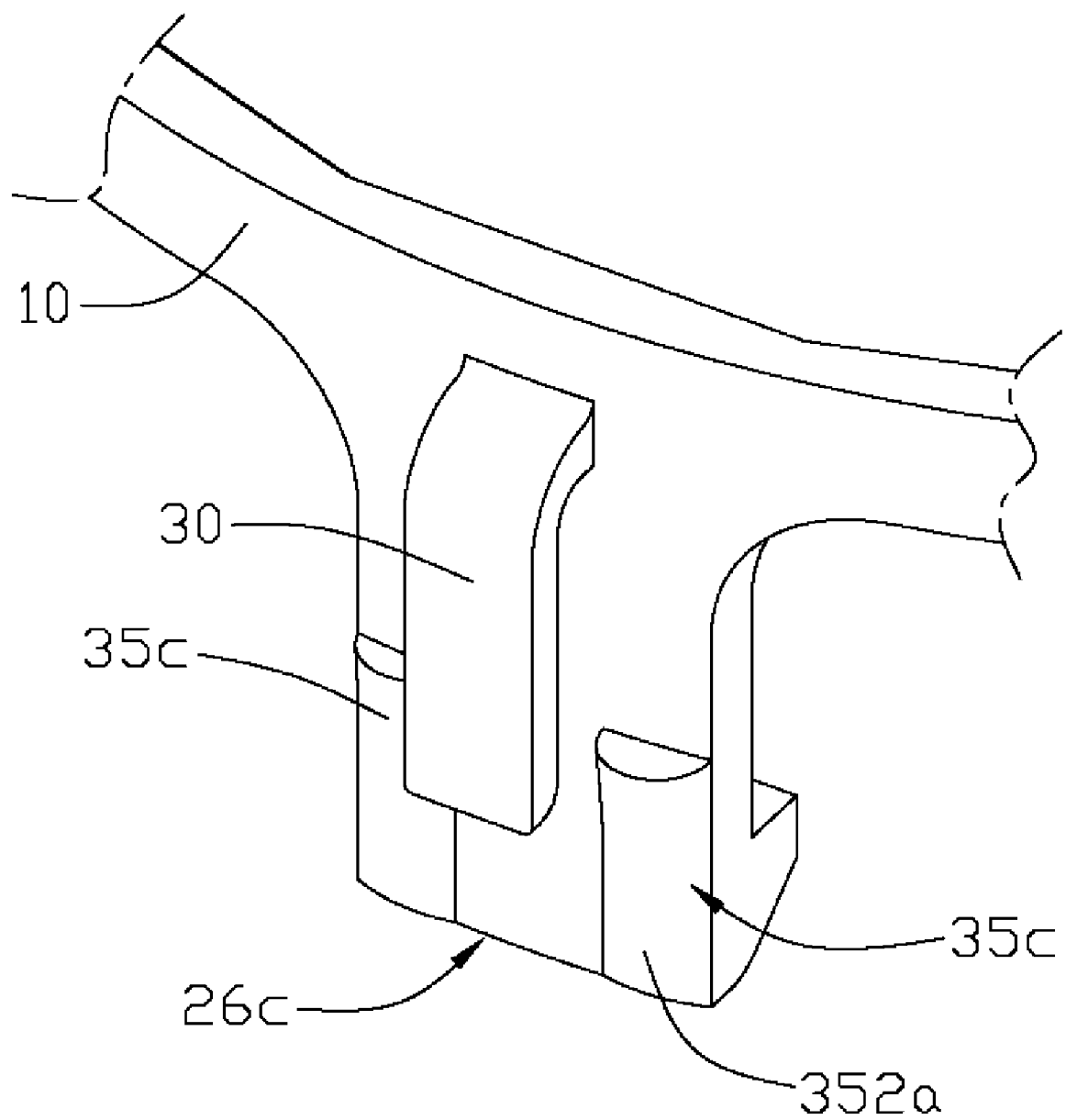
FIG. 7 shows an isometric view of a securing arm and a securing tab of the fan frame in accordance with a fourth embodiment of the present invention.

FIGS. 6-7 respectively show securing arms 26*b*, 26*c* each having two blocks 35*b*, 35*c*. The blocks 35*b*, 35*c* of the securing arms 26*b*, 26*c* have different shapes. The two blocks 35*b*, 35*c* of each securing arm 26*b*, 26*c* are respectively formed on the left portion and right portion of the securing arm 26*b*, 26*c*, and are respectively located on the left and right sides of the securing tab 30. As shown in FIG. 6, each block 35*b* is wedge-shaped and forms the slanted guiding surface 352 to guiding the wires 40 into the space 80. The blocks 35*b* are mirror images to each other. FIG. 7 shows the block 35*c* being tapered and forming the curve-shaped guiding surface 352*a* to guiding the wires 40 into the space 80. The blocks 35 have the same shape to each other.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fan frame for an electric fan, comprising:
a main body with conducting wires being secured thereon;
a securing tab extending outwardly from a first side of an outer surface of the main body, the securing tab having a free end being spaced from the main body, a groove for extension of the wires therethrough being defined between the securing tab and the outer surface of the main body;
a block extending outwardly from a second side opposite to the first side of the outer surface of the main body, cooperatively the block, the securing tab and the outer surface of the main body defining a space for receiving the wires, a guiding surface being formed on an outer surface of the block for guiding the wires into the space, a top end of the block being located above a lower end of the securing tab.

2. The fan frame of claim 1, wherein a securing arm extends from the main body along an axial direction thereof, the block being formed on an outer surface of the securing arm.

3. The fan frame of claim 2, wherein the securing tab and the block are spaced from each other along a circumferential direction of the main body, the block forms a holding surface connecting with the outer surface of the securing arm at the top end of the block.

4. The fan frame of claim 3, wherein the holding surface is of a shape selected from the group consisting of triangle-shaped and semicircle-shaped.

5. The fan frame of claim 3, further comprising a second block formed on the securing arm, the two blocks being respectively arranged on two opposite sides of the securing tab.

6. The fan frame of claim 2, wherein a hook is formed on an inner surface of the securing arm for engaging with a heat dissipation apparatus to assemble the fan frame thereon.

7. The fan frame of claim 2, wherein a slot is defined in the securing arm corresponding to a position of the securing tab.

8. The fan frame of claim 2, wherein the securing tab extends outwardly from the main body and then is bent perpendicularly downwardly.

9. The fan frame of claim 1, wherein the guiding surface is one of slant-shaped and curve-shaped.

10. The fan frame of claim 1, further comprising a retaining tab for securing the wires thereon, the retaining tab extending outwardly from the main body along a circumferential direction of the main body, a groove being defined between the retaining tab and the main body for extension of the wires therethrough.

11. A fan frame for an electric fan, comprising:
a round main body with conducting wires being secured thereon;
a securing arm extending from the main body along an axial direction thereof;
a securing tab extending outwardly from a first side of an outer surface of the main body, the securing tab having a free end being spaced from the main body, a groove for extension of the wires therethrough being defined between the securing tab and the outer surface of the main body;
a block extending outwardly from an outer surface of the securing arm at a position below the first side of the outer surface of the main body; and
a holding surface being formed at an end of the block near the securing tab and extending from the outer surface of the securing arm, cooperatively the holding surface of the block, the securing tab and the outer surface of the main body defining a space receiving the wires.

12. The fan frame of claim 11, wherein a guiding surface is formed on an outer surface of the block for guiding the wires to move into the space, the guiding surface is one of slant-shaped and curve-shaped.

13. The fan frame of claim 11, wherein the holding surface is one of triangle-shaped and semicircle-shaped.

14. The fan frame of claim 11, further comprising a second block formed on the securing arm, the two blocks being respectively arranged on two opposite sides of the securing tab.

15. The fan frame of claim 11, wherein a slot is defined in the securing arm corresponding to a position of the securing tab.

16. A fan frame of an electronic fan comprising:
a main body adapted for receiving a stator and a rotor of the fan therein;
first and second securing arms extending downwardly from the main body, each having a hook adapted for securing the main body to a heat dissipation device;
a resilient retaining tab circumferentially extending from the main body and above the first securing arm, wherein a first groove is defined between the retaining tab and the main body;
a resilient securing tab extending downwardly from the main body toward the second securing arm, wherein a second groove is defined between the securing tab and the main body and between the securing tab and the second securing arm;
a guiding block protruding from the second securing arm toward the securing tab, the guiding block having an outer guiding surface; and
at least a wire having a first end adapted for securing to the fan and a second end adapted for connecting with a power source, the at least a wire extending through the first and second grooves, the guiding surface guiding the at least a wire into the second groove.

17. The fan frame of claim 16, wherein the main body is round in shape and a section of the at least a wire adjacent to the second end thereof is received in the first groove.

18. The fan frame of claim 16, wherein the block has a holding face at an upper end thereof, for preventing the at least a wire for escaping the second groove.

19. The fan frame of claim 18, wherein the holding face extends horizontally and outwardly from the second securing arm and comprises one of following shapes: triangle and semicircle.

20. The fan frame of claim 18, wherein the outer guiding surface has one of following shapes: slant and curve.

* * * * *